(12) United States Patent
Kim

(10) Patent No.: US 7,777,400 B2
(45) Date of Patent: Aug. 17, 2010

(54) PLASMA DISPLAY APPARATUS HAVING A BENT CHASSIS BASE

(75) Inventor: Sok-San Kim, Suwon-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 809 days.

(21) Appl. No.: 11/181,496

(22) Filed: Jul. 13, 2005

(65) Prior Publication Data
US 2006/0043854 A1    Mar. 2, 2006

(30) Foreign Application Priority Data
Aug. 28, 2004   (KR) ...................... 10-2004-0068307

(51) Int. Cl.
*H01J 17/00*      (2006.01)
*H05K 7/18*       (2006.01)
(52) U.S. Cl. ..................... 313/36; 361/831; 361/800; 361/688; 313/46; 313/581; 313/582
(58) Field of Classification Search ........................ None
See application file for complete search history.

(56) References Cited

U.S. PATENT DOCUMENTS

| | | | |
|---|---|---|---|
| 6,407,508 B1 | 6/2002 | Kawada et al. | |
| 6,534,722 B2 * | 3/2003 | Takaoka | ..................... 349/150 |
| 6,677,664 B2 * | 1/2004 | Inoue et al. | .................. 257/668 |
| 7,282,842 B2 * | 10/2007 | Kim et al. | ..................... 313/46 |
| 7,432,652 B2 * | 10/2008 | Kim et al. | .................... 313/582 |

(Continued)

FOREIGN PATENT DOCUMENTS

CN       1402319 A       3/2003

(Continued)

OTHER PUBLICATIONS

Japanese Office Action issued on Aug. 12, 2008 by the Japanese Patent Office in Japanese Patent Application No. 2005-178472.

(Continued)

*Primary Examiner*—Mariceli Santiago
*Assistant Examiner*—Natalie K Walford
(74) *Attorney, Agent, or Firm*—Knobbe Martens Olson & Bear, LLP

(57) ABSTRACT

A plasma display assembly having increased structural rigidity without using a reinforcing member is disclosed. The plasma display assembly includes a PDP, a chassis base and at least one or more circuit boards so as to provide the electromechanical structures to produce an image. The chassis base supporting the PDP at a rear side thereof includes a base part and at least one extended bent part. The base part is formed substantially parallel to the PDP. The extended bent part is formed in at least one of upper, lower, left and right edges of the base part, and includes a first bent part bent with respect to the base part to extend rearwardly, a second bent part bent with respect to the first bent part to extend in a direction parallel to the chassis base, and a third bent part bent with respect to the second bent part to extend forwardly. The circuit boards are arranged to be connected to at the rear side of the chassis base and drive the PDP during operation.

15 Claims, 10 Drawing Sheets

U.S. PATENT DOCUMENTS

2003/0141576 A1  7/2003  Kawada et al.

FOREIGN PATENT DOCUMENTS

| | | |
|---|---|---|
| CN | 200510093959.5 | 7/2009 |
| JP | 11-146305 A | 5/1999 |
| JP | 2000-200978 | 7/2000 |
| JP | 2000-299416 | 10/2000 |
| JP | 2001-013883 | 1/2001 |
| JP | 2001-324942 | 11/2001 |
| JP | 2001-352022 | 12/2001 |
| JP | 2002-014625 | 1/2002 |
| JP | 2002-006755 | 2/2002 |
| JP | 2002-351346 | 12/2002 |
| JP | 2003-108017 | 4/2003 |
| JP | 2003-115568 | 4/2003 |
| KR | 10-2002-0081636 | 10/2002 |
| KR | 10-2003-0024413 | 3/2003 |

OTHER PUBLICATIONS

Office Action issued by the Chinese Patent Office on Mar. 28, 2008 for Chinese Patent Application No. 200510093959.5.

* cited by examiner

PLASMA DISPLAY APPARATUS HAVING A BENT CHASSIS BASE

CROSS-REFERENCE TO RELATED PATENT APPLICATION

This application claims the benefit of Korean Patent Application No. 10-2004-0068307, filed on Aug. 28, 2004, in the Korean Intellectual Property Office, the disclosure of which is incorporated herein in its entirety by reference.

BACKGROUND OF THE INVENTION

1. Field of the Invention

The present invention relates to a chassis for supporting a plasma display panel (PDP), or other like flat display panel, and circuit boards.

2. Description of the Related Technology

A plasma display apparatus is a type of flat display apparatus used to display an image by using a gas discharge phenomenon, and is being spotlighted as a next-generation image display device because it can be made to have a thin thickness of several centimeters or below, a wide screen and a wide viewing angle of 150° or above.

FIG. 1 is an exploded perspective view of a conventional plasma display apparatus. Referring to FIG. 1, a plasma display apparatus 10 includes a chassis base 40, a plasma display panel (PDP) 20 supported at the front of the chassis base 40 so as to produce an image, and a circuit board 60 supported at the rear of the chassis base 40 so as to drive the PDP 20. The PDP 20 and the chassis base 40 are connected to each other with double sided tapes 35 positioned around a transfer 30.

The PDP 20 includes a front panel 21 and a rear panel 22, and a plurality of electrodes are formed on the front and rear panels 21 and 22. An electric discharge is generated from discharge gas between the electrodes by a voltage applied to the electrodes, a phosphor is excited by UV rays radiated by the discharge, and an image is produced by light emitted by the excited phosphor.

The plasma display apparatus 10 is made in such a way that the front and rear panels 21 and 22 are separately manufactured and then combined into the PDP 20, the chassis base 40 is assembled at the rear of the PDP 20, the circuit board 60 is installed in the chassis base 40, and the resulting structure is finally installed in a case (not shown).

The chassis base 40, which is generally a flat panel and has an edge bent in a "⌐" (or 90°) shape, supports the PDP 20 and dissipates heat transmitted from the PDP 20.

With a recent trend toward thickness reduction of the plasma display apparatus 10, the chassis base 40 is becoming thinner. Accordingly, the chassis base 40 tends to twist and flex, and thus cannot support the PDP 20 as well as a previous thicker chassis. That is, the thinner chassis base 40 alone is not rigid enough to adequately protect the PDP 20. Specifically, corner portions 45 of the chassis base 40 tend to break because the rigidity of the chassis base 40 is not sufficient.

In order to solve such a problem, reinforcement members 50 are installed on a rear surface of the chassis base 40. The reinforcement members 50 are connected to parts of the rear surface of the chassis base 40 in a "⌐" or "⊏" (or 90° or 180° bend) shape to thereby reinforce the chassis base 40. The reinforcement members 50 arranged at edges of the rear surface of the chassis base 40 function also as seat plates for supporting signal-transmission members 70 such as tape carrier packages (TCP) that are widely used for electrically connecting the PDP 20 and the circuit board 60.

However, the reinforcement members 50 (for reinforcing the chassis base 40) and the seat plates (for supporting the signal-transmission members 70) are separately installed, whereby the numbers of components and assembling processes and the manufacturing cost for the plasma display apparatus are undesirably increased.

Also, the reinforcement members 50 are made of metal such as aluminum or iron, whereby the total weight of the plasma display apparatus is undesirably increased.

Further, corner portions of the PDP 20 are exposed due to the lack of coverage of the corner portions 45. Because of this, the corner portions of the PDP 20 can be damaged during shipping of the PDP 20.

Furthermore, when the reinforcement members 50 are installed on a rear surface of a chassis base of a small-sized (35 inches or below) PDP, most if not all of the rear surface area of the chassis base may be needed for installation for the circuit boards 60. Such a surface area problem becomes more serious when more circuit boards 60 must be installed on the rear surface of the chassis base so as to produce a high-resolution display image.

SUMMARY OF CERTAIN INVENTIVE ASPECTS

Certain inventive aspects provide a plasma display apparatus that has an increased structural rigidity even without using a reinforcing member and can protect corner portions of its PDP.

The present invention also provides a plasma display apparatus having a structure in which elements provided in a signal-transmission member are firmly seated and the heat of the elements is smoothly exhausted to the outside.

According to an aspect of the present invention, there is provided a plasma display apparatus including a PDP, a chassis base and at least one or more circuit boards.

The PDP produces an image. The chassis base supporting the PDP at a rear side thereof includes a base part and at least one extended bent part. The base part is formed substantially parallel to the PDP. The extended bent part is formed at least one of upper, lower, left and right edges of the base part, and includes a first bent part bent with respect to the base part to extend reward, a second bent part bent with respect to the first bent part to extend in a direction parallel to the chassis base, and a third bent part bent with respect to the second bent part to extend forward. The circuit boards are arranged to be connected to a rear side of the chassis base and drives the PDP.

The PDP and the circuit boards may be electrically connected by a signal-transmission member, and the signal-transmission member may be formed to cover the third bent part and the second bent part.

An element seat groove formed in a shape concave toward the PDP may be formed at the second bent part or the third bent part.

According to another aspect of the present invention, there is provided a plasma display apparatus including a PDP (plasma display panel) producing an image, a chassis base supporting the PDP at a rear side thereof, and at least one or more circuit boards arranged to be connected to a rear side of the chassis base and driving the PDP.

The chassis base includes a base part, at least one extended bent part formed at least one of upper, lower, left and right edges of the base part, and a connection corner part connecting the neighboring extended bent part. The base part is arranged substantially parallel to the PDP. The extended bent part includes a first bent part bent with respect to the base part to extend rearward, a second bent part bent with respect to the first bent part to extend in a direction parallel to the chassis base, and a third bent part bent with respect to the second bent part to extend forward.

The connection corner part and the extended bent part may be formed in one body. In this case, the extended bent part and the connection corner part may be formed through a drawing process.

BRIEF DESCRIPTION OF THE DRAWINGS

The above and other features and advantages of certain inventive aspects are discussed with further detailed exemplary embodiments with reference to the attached drawings in which.

DETAILED DESCRIPTION OF CERTAIN INVENTIVE EMBODIMENTS

Certain inventive embodiments will now be described more fully with reference to the accompanying drawings, in which exemplary embodiments are shown.

Figure 2:
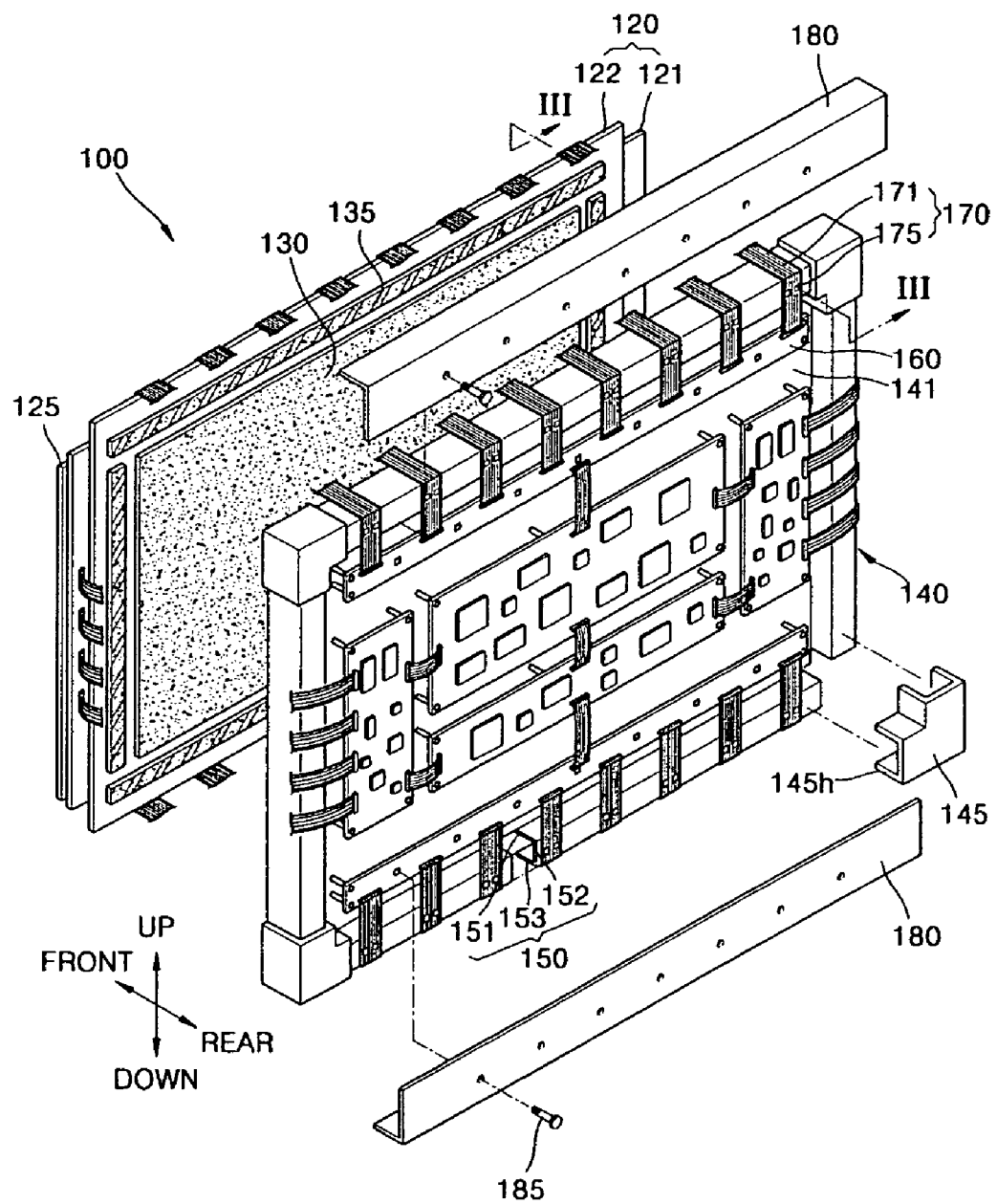
FIG. 2 is an exploded perspective view of a plasma display apparatus according to a first embodiment.

FIG. 2 is an exploded perspective view of a plasma display apparatus according to a first embodiment. Referring to FIG. 2, a plasma display apparatus 100 includes a PDP 120, a chassis base 140 supporting the PDP 120, and a plurality of circuit boards 160 installed at the rear of the chassis base 140.

The PDP 120 may be any one of various PDPs. For example, if the PDP 120 is a surface discharge AC (alternating current) PDP, it may include a front panel 121 and a rear panel 122. The front panel 121 may include a front substrate, a plurality of sustain electrode pairs formed on the front substrate, a front dielectric layer burying the sustain electrode pairs, and a protective layer covering the front dielectric layer. The rear panel 122 faces the front panel 121, and may include a rear substrate, a plurality of address electrodes formed on the rear substrate to located at positions corresponding to the sustain electrode pairs, a rear dielectric layer burying the address electrodes, barrier ribs formed between the front and rear dielectric layers to thereby limit a discharge space and prevent crosstalk, and phosphor layers arranged in the discharge space and formed to be able to produce colored light.

A filter 125 may be installed at the front of the PDP 120. The filter 125 includes an electromagnetic wave shielding layer for shielding a person from electromagnetic waves generated when the PDP 120 is driven, or operated.

In the illustrated embodiment, the chassis base 140 is arranged at the rear of the PDP 120. The chassis base 140 supports the PDP 120, and receives heat from the PDP 120 to then exhaust the heat from the plasma display apparatus 100 to an outside thereof.

The PDP 120 and the chassis base 140 may be connected to each other with adhesive members 135 such as pieces of double sided tape. A heat transfer sheet 130 may be provided between the PDP 120 and the chassis base 140, and exhausts heat generated at the PDP 120 from the plasma display apparatus 100 via the chassis base 140 to the outside.

At least one circuit board 160 may be installed at the rear of the chassis base 140 connected to the PDP 120. The circuit boards 160 are generally equipped with devices for driving the PDP 120. The PDP driving devices generally include a device for supplying a power source to the PDP 120, and a device for applying a signal for producing an image to the PDP 120.

The PDP 120 and the chassis base 140 may be installed in a case (not shown).

Figure 3:
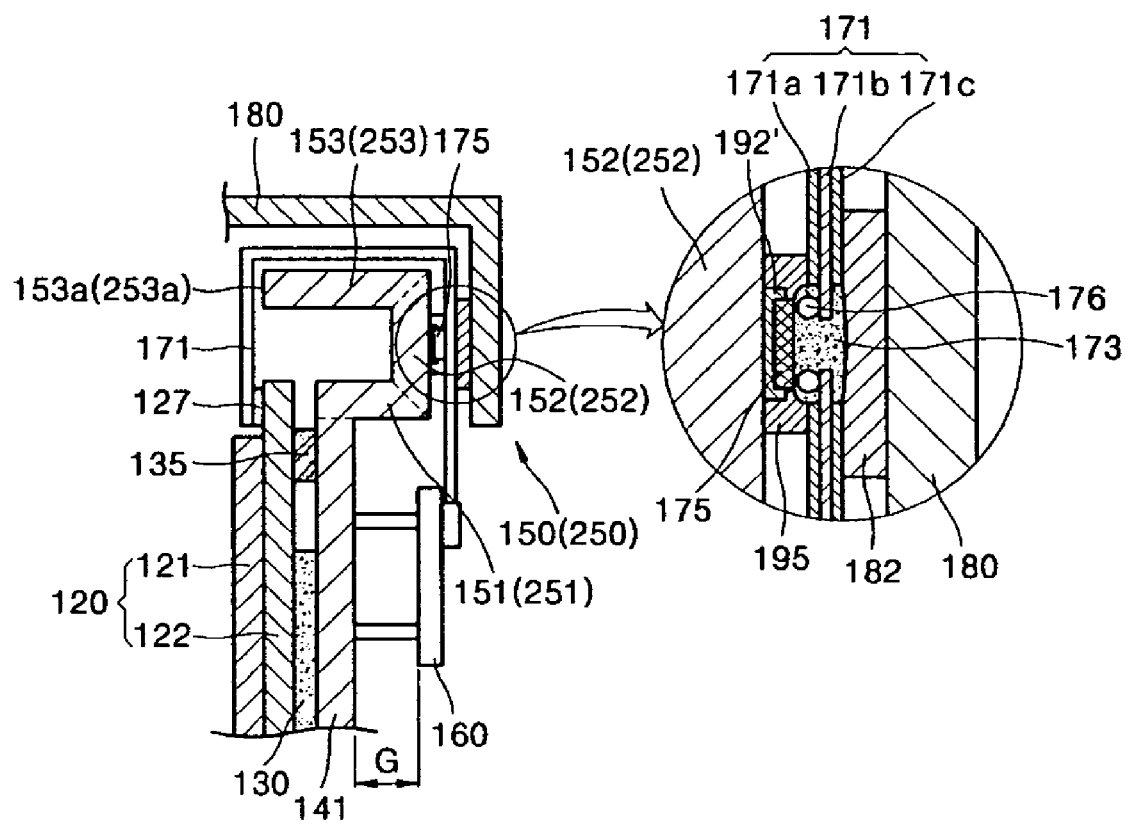
FIG. 3 is a cross-sectional view illustrating a side of the plasma display apparatus taken along line III-III in FIG. 2.

FIG. 3 is a cross-sectional view illustrating a side of the plasma display apparatus taken along line III-III in FIG. 2. Referring to FIGS. 2 and 3, the chassis base 140 includes a base part 141 and an extended bent part 150. The base part 141 is substantially parallel to the PDP 120, and supports the PDP 120 positioned at the front thereof and the circuit boards 160 positioned at the rear thereof. The extended bent part 150 may be formed along at least one of the upper, lower, left or right edges of the base part 141. The extended bent part 150 generally includes a first bent part 151, a second bent part 152 and/or a third bent part 153. The first bent part 151 is bent with respect to the base part 141 to extend rearward, the second bent part 152 is bent with respect to the first bent part 151 to extend in a direction parallel to the chassis base 140, and the third bent part 153 is bent with respect to the second bent part 152 to extend forward.

Figure 1:
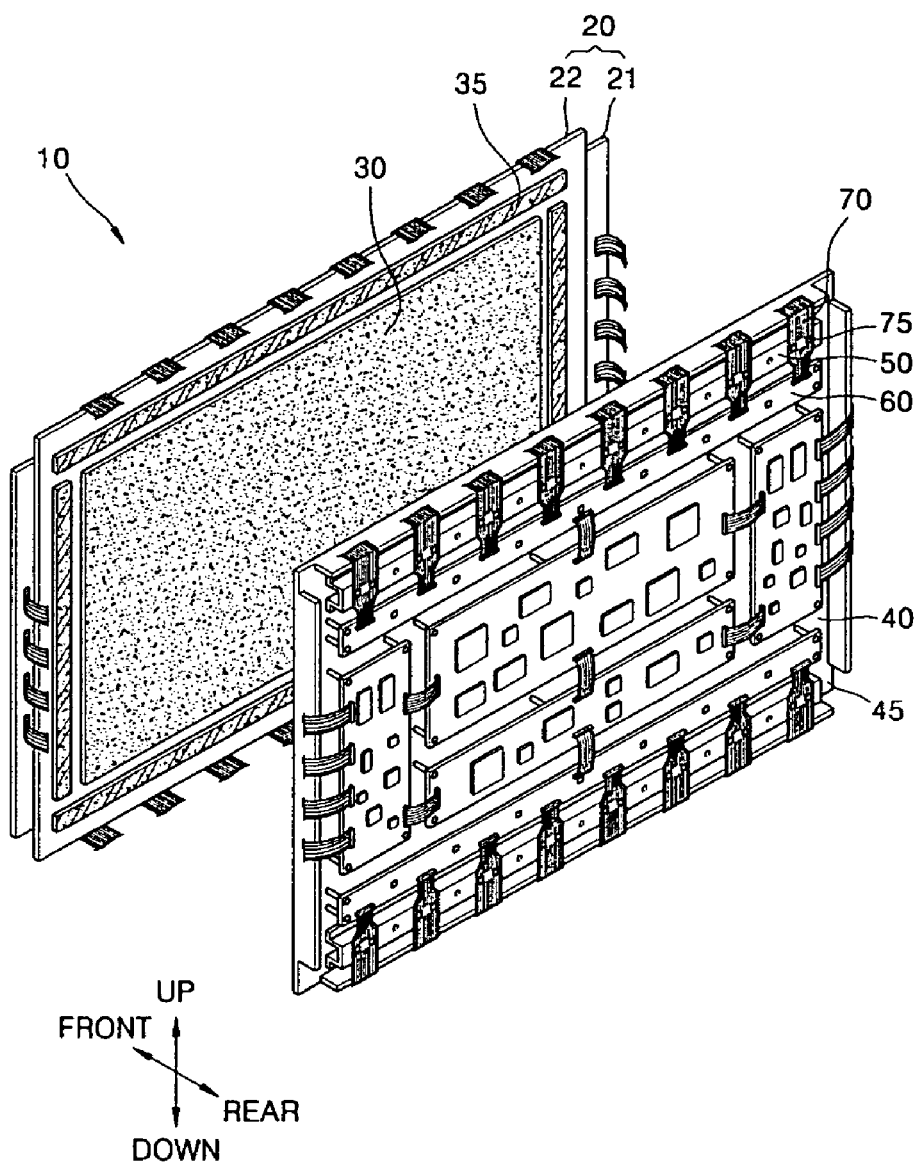
FIG. 1 is an exploded perspective view of a conventional plasma display apparatus.

When compared to a conventional chassis base, the chassis base 140 is enhanced in flexural rigidity because it has edges bent several times. Accordingly, the reinforcement members 50 shown in FIG. 1 are unnecessary or less necessary for the chassis base 140. In this case, as shown in FIG. 3, an extended end portion 153a of the third bent part 153 is positioned further forward than the base part 141 so as to further enhance the rigidity of the chassis base 140 and to shield the PDP 120.

The circuit boards 160 transmit electric signals via at least one or more signal-transmission members 170 to the PDP 120 to thereby drive the PDP 120. The signal-transmission member 170 has one end connected to the PDP 120 (specifically, electrodes of the PDP 120) with an anisotropic conductive adhesive 127 and the other end connected to the circuit board 160, thereby transmitting power and a driving signal generated at the circuit board 160 to the PDP 120.

The signal-transmission member 170 is formed to cover the third and second bent parts 153 and 152 to then be firmly seated on the chassis base 140 and be connected to the circuit board 160, thereby making it possible to electrically connect the electrode of the PDP 120 to the circuit board 160 in a stable manner.

The first bent part 151 may be extended rearward from the base part 141 as high as the position of the circuit board 160, and the second bent part 152 bent and extended from the first bent part 151 may be arranged to align with the circuit board 160. Accordingly, the signal-transmission member 170 is firmly seated on the second bent part 152 and may be flatly extended without being bent and is then connected to the circuit board 160, where it can be more stably connected to the circuit board 160. In this case, since the circuit board 160 is arranged spaced apart from the base part 141 by a gap (G) of at least 6 millimeters (so as to satisfy a safety standard such as an Underwriters Laboratories (UL) standard) the first bent part 151 may also be extended rearward from the base part 141 by at least 6 millimeters.

In addition, the third bent part 153 may be extended further forward than the base part 141 so that its extended portion 153a can be positioned further forward than the base part 141. This makes it possible not only to enhance the rigidity of the chassis base 140, but also to more securely attach the signal-transmission member 170 on the bent part 150 (specifically, the second bent part 152). Accordingly, the extended end portion 153a of the third bent part 153 may be positioned as forward as the anisotropic conductive adhesive 127.

The signal-transmission member may be a tape carrier package (TCP), a chip on film (COF), or other signal-transmission device. In FIGS. 2 and 3, the signal-transmission member 170 is a TCP formed by installing at least one device 175 (such as a driving IC device) in a tape-type interconnection part 171.

As shown in FIG. 3, the tape-type interconnection part 171 includes a base film 171a, a conductive layer 171b formed on a lower surface of the base film 171a so as to be extended in a longitudinal direction of the base film 171a, and a resist layer 171c insulating the conductive layer 171b and protecting the same from the outside. The device 175 is connected to the conductive layer 171b to thereby convert a driving signal received from the circuit board 160 and apply the resulting signal to the PDP 120.

The device 175 may be flip-chip bonded to the interconnection part 171. That is, a circuit in the device 175 is electrically connected to the conductive layer 171B of the interconnection part 171 by a conductive bump 176. A space below the device 175 may be charged with an insulative resin such as epoxy molding compounds (EMC), thereby mechanically reinforcing the connection between the device 175 and the interconnection part 171 and protecting from foreign particles which could cause a short.

A heat conductive member 192' may be formed between at least the device 175 and the second bent part 152. The heat conductive member 192' not only attaches the device 175 to the second bent part 152 but also exhausts heat generated from the device 175 to the outside. Further, since the temperature of the device 175 increases up to about 70° C. through 90° C., the heat conductive member 192' may advantageously have high heat conductivity.

The heat conductive member 192' may be a liquid or gel-type conductive medium such as a grease, or may also be a solid flat heat exhaust member. Other types of heat conductive members 192' may also be used. Heat transmitted via the heat conductive member 192' to the second bent part 152 is exhausted to the outside through convective heat transfer, but conductive or radiation heat transfer may also apply.

Additional reinforcement members 50 (see FIG. 1) are not necessary because the device 175 may be arranged to be securely seated on the extended bent part 150. Because of this, the number of components and manufacturing costs for a plasma display apparatus can be reduced.

In addition, a shield plate 180 is provided at an outer side of the signal-transmission member 170, and can shield and protect the outside of the signal-transmission member 170 and the device 175. The shield plate 180 is made of metal such as aluminum, and is attached to the chassis base 140 with a fixing member such as a screw 185 to thereby be grounded. In this case, a heat transfer strip 182 may be formed between at least the device 175 and the shield plate 180, whereby heat generated from the device 175 can be efficiently exhausted via the transfer 182 and the shield plate 180 to the outside.

Further, a side heat exhaust member 195 may be formed to cover both sides of the device 175, and dissipate heat generated from the both sides of the device 175.

The side heat exhaust member 195 may be formed with an epoxy resin. That is, the side heat exhaust member 195 may be formed in such a way that a hardened solid epoxy resin covers both sides of the device 175. Also, the side heat exhaust member 195 may be formed of a ceramic series. The ceramic series may have superior heat conductivity and heat radiation efficiency. Accordingly, when the side heat exhaust member 195 is made of a ceramic series, the heat exhaust efficiency of the device 175 is generally further enhanced. However, the present invention is not limited to this configuration, and any material of sufficient heat conductivity may be used as a material for the side heat exhaust member 195.

Figure 4:
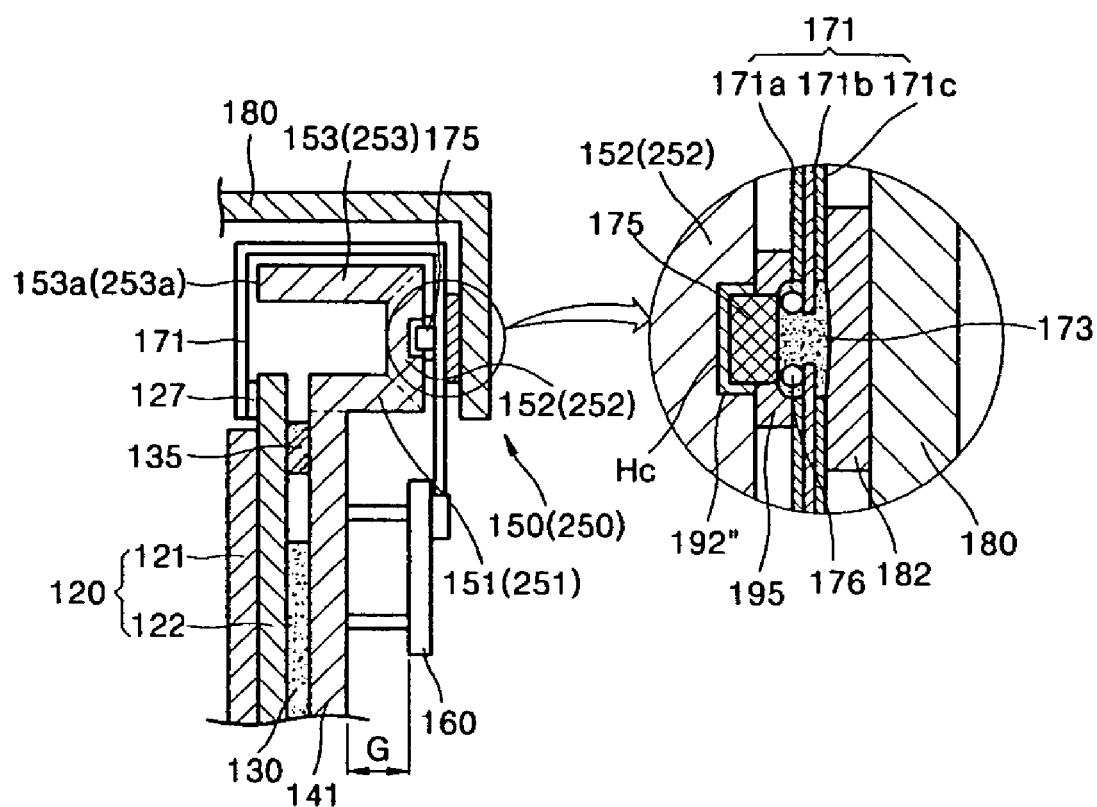
FIG. 4 is a cross-sectional view illustrating a modification of the embodiment shown in FIG. 3.

FIG. 4 is a cross-sectional view illustrating a modification of FIG. 3. As shown in FIG. 4, an element seat groove Hc may be concavely formed toward the PDP 120 in a portion of the second bent part 152 on which the element 155 is formed. Accordingly, the device 175 is received in the element seat groove Hc in such a way as not to be exposed to the outside. This helps prevent damage to the device 175.

Shown in FIG. 4 heat conductive member 192" is formed between at least the device 175 and an inner surface of the element seat groove Hc. The heat conductive member 192" not only attaches the device 175 to the element seat groove Hc but also exhausts heat generated from the device 175 to the outside. Here, since the temperature of the device 175 increases up to about 70° C. through 90° C., the heat conductive member 192" may have high heat conductivity. The heat conductive member 192" may be a liquid or gel-type conductive medium such as a grease, or may also be a solid flat heat exhaust member. Other types of heat conductive members 192' may also be used.

A side heat exhaust member 195 is formed between the second bent part 152 and the signal-transmission member 170 in such a way as to cover both sides of the device 175, a shield plate 180 is arranged at an outer side of the signal-transmission member 170, and a heat conductive sheet 182 is formed between the device 175 and the shield plate 180.

Figure 5:
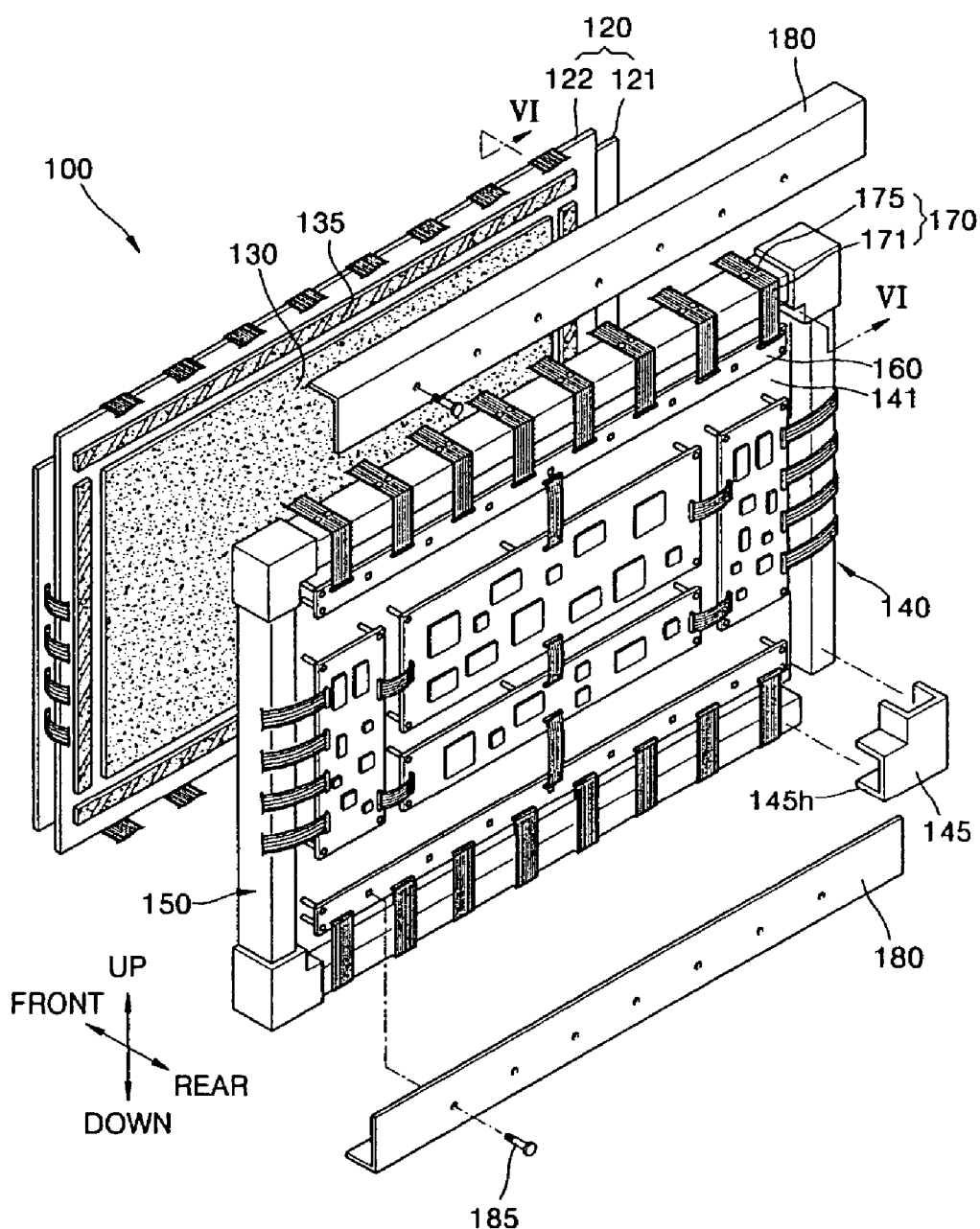
FIG. 5 is an exploded perspective view illustrating a modification of the plasma display apparatus shown in FIG. 2.
Figure 6:
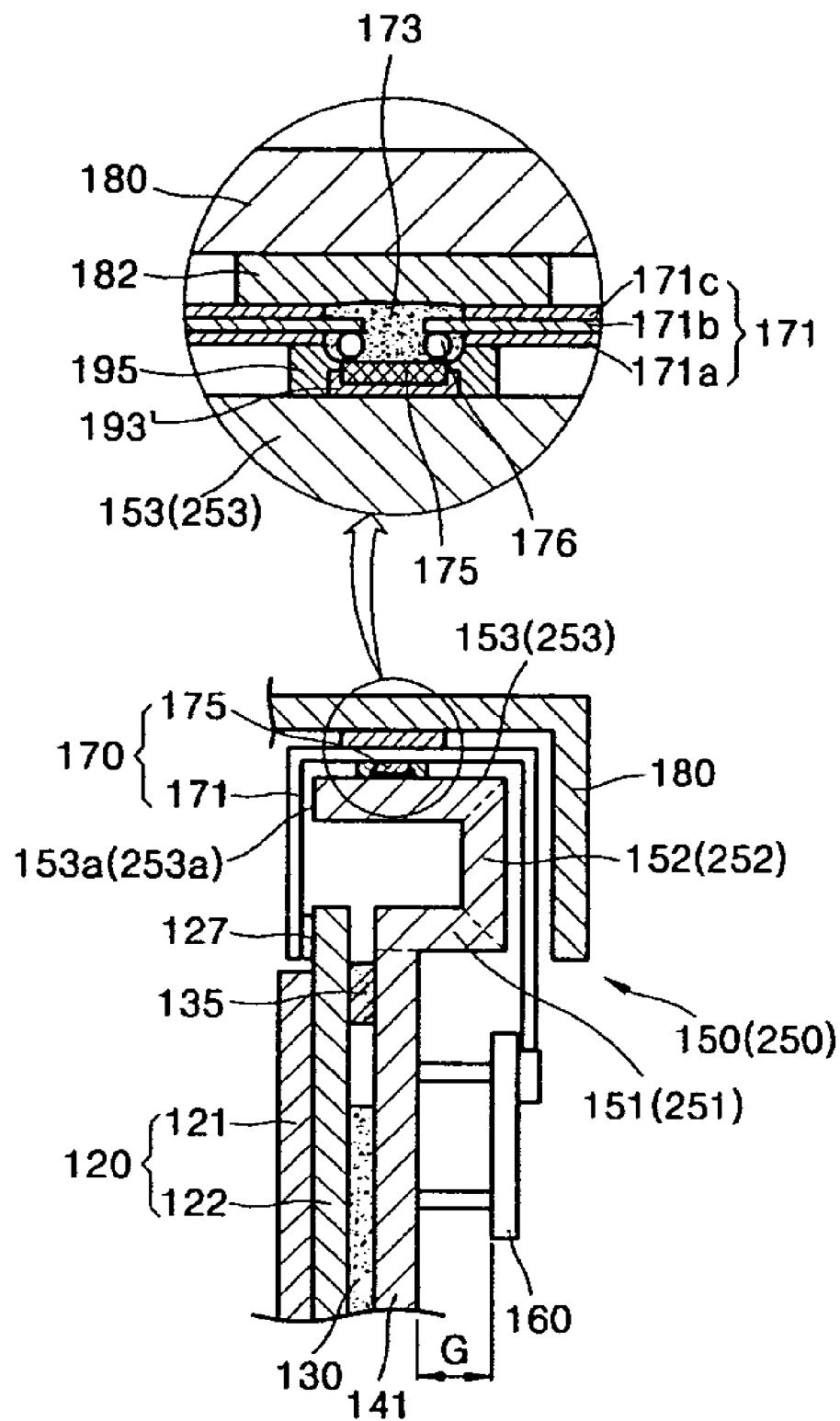
FIG. 6 is a cross-sectional view illustrating a side of the plasma display apparatus taken along line VI-VI in FIG. 5.

FIG. 5 is an exploded perspective view illustrating a modification of the plasma display apparatus shown in FIG. 2. FIG. 6 is a cross-sectional view illustrating a side of the plasma display apparatus taken along line VI-VI in FIG. 5. As shown in FIG. 5, the device 175 of the signal-transmission member 170 may be formed at the third bent part 153. In this case, as shown in FIG. 6, a heat conductive member 193' is formed between at least the device 175 and the third bent part 153. A shield plate 180 is formed at an outer side of the signal-transmission member 170 in such a way to shield the signal-transmission member 170. A transfer 182 is formed between at least the device 175 and an inner surface of the shield plate 180.

Figure 7:
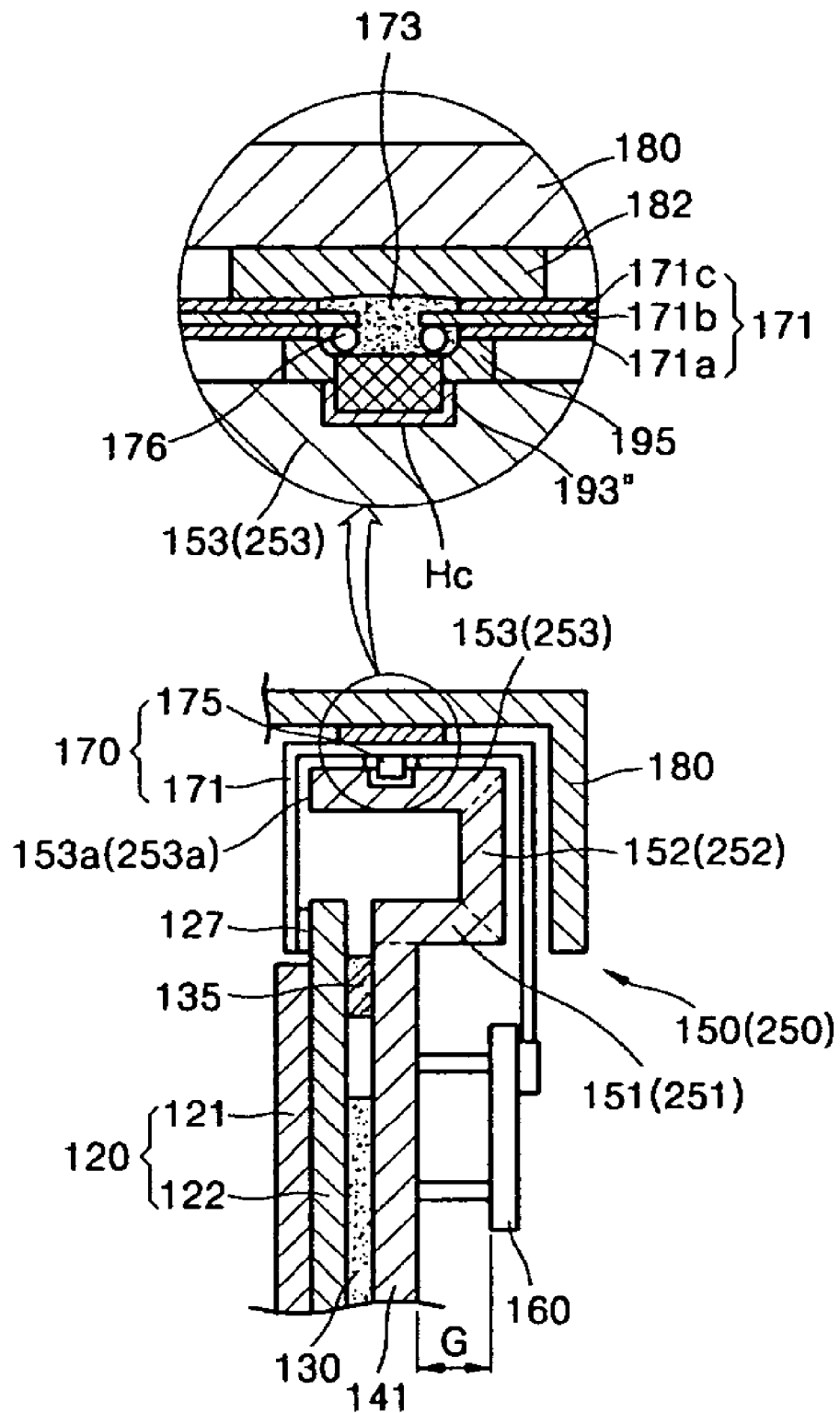
FIG. 7 is a cross-sectional view illustrating a modification of the embodiment shown in FIG. 6.

FIG. 7 is a cross-sectional view illustrating a modification of FIG. 6. As shown in FIG. 7, an element seat groove Hc may be formed in the third bent portion 153, and the device 175 may be formed in the element seat groove Hc. A heat conductive member 193" is formed between at least the device 175 and the element seat groove Hc. Also, a shield plate 180 may be formed at an outer side of the signal-transmission member 170 in such a way to shield the signal-transmission member 170, and a transfer 182 is formed between at least the device 175 and an inner surface of the shield plate 180.

Although the extended bent part 150 may be formed at each of the upper, lower, left and right edges of the chassis base 140, it may be formed at only the upper and lower edges of the chassis base 140, or other edges singly or in combination. In this case, since the width of the PDP 120 is generally greater than the length of the PDP 120 and consequently the width of the chassis base 140 is generally greater than the length of the chassis base 140, the extended bent part 150 is formed at the upper and lower edges of the chassis base 140 to thereby improve the rigidity of the chassis base 140. However, the extended bent part 150 may be formed at only the left and right edges of the chassis base 140. Other variations may also be used.

As shown in FIGS. 2 and 5, connection brackets 145 may be connected between neighboring extended bent parts 150, for example, between an upper extended bent part 150 and the left and right extended bent parts 150, and between a lower extended bent part 150 and the left and right extended bent parts 150. The connection bracket 145 has both end portions each having a connection groove 145h formed corresponding to the first, second and third bent parts 151, 152 and 153, and is bent by 90°. The connection bracket 145 connects the neighboring extended bent parts 150, to thereby further improve the rigidity of the chassis base 140, and protect the corner portions of the base 141. The connection bracket 145 may be made of materials such as, but not limited to a rigid plastic.

When the extended bent part 150 is formed at all of the upper, lower, left and right edges of the chassis base 140 and when the neighboring extended bent parts 150 are connected with each other, the rigidity of the chassis base 140 can be effectively improved.

Figure 8:
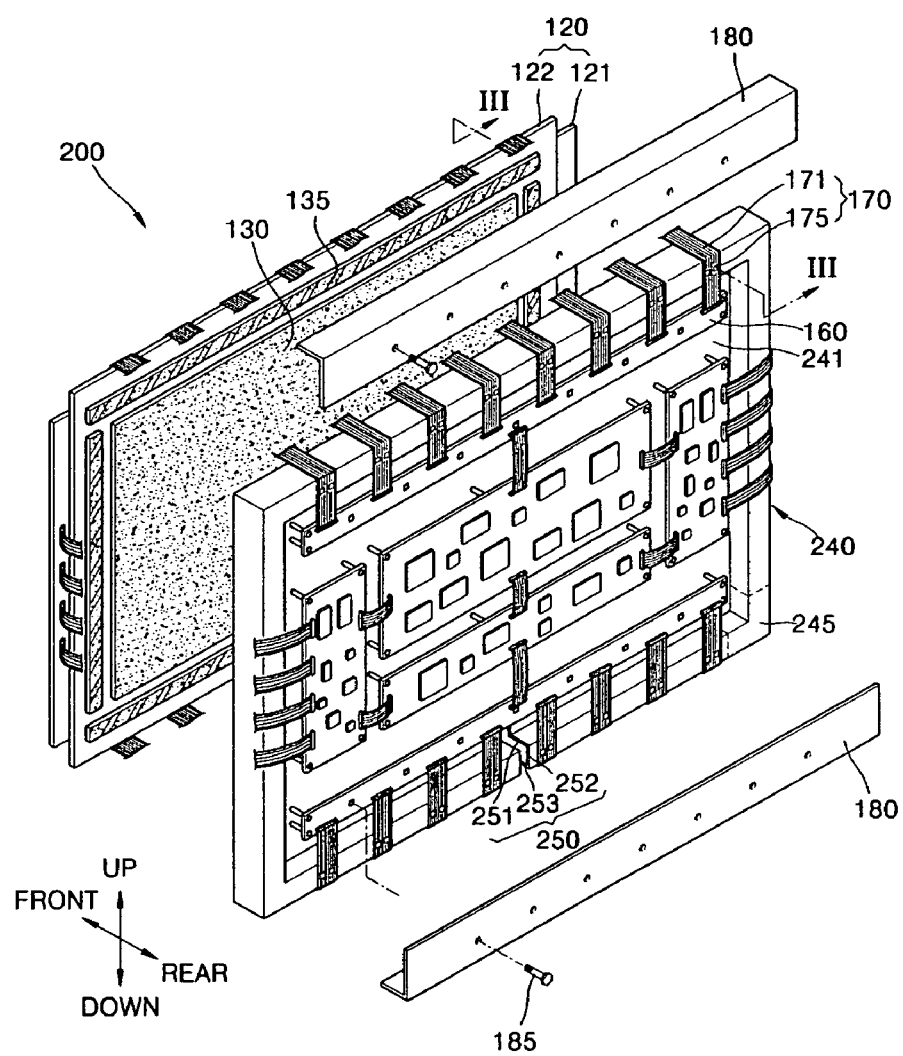
FIG. 8 is an exploded perspective view of a plasma display apparatus according to a second embodiment.
Figure 9:
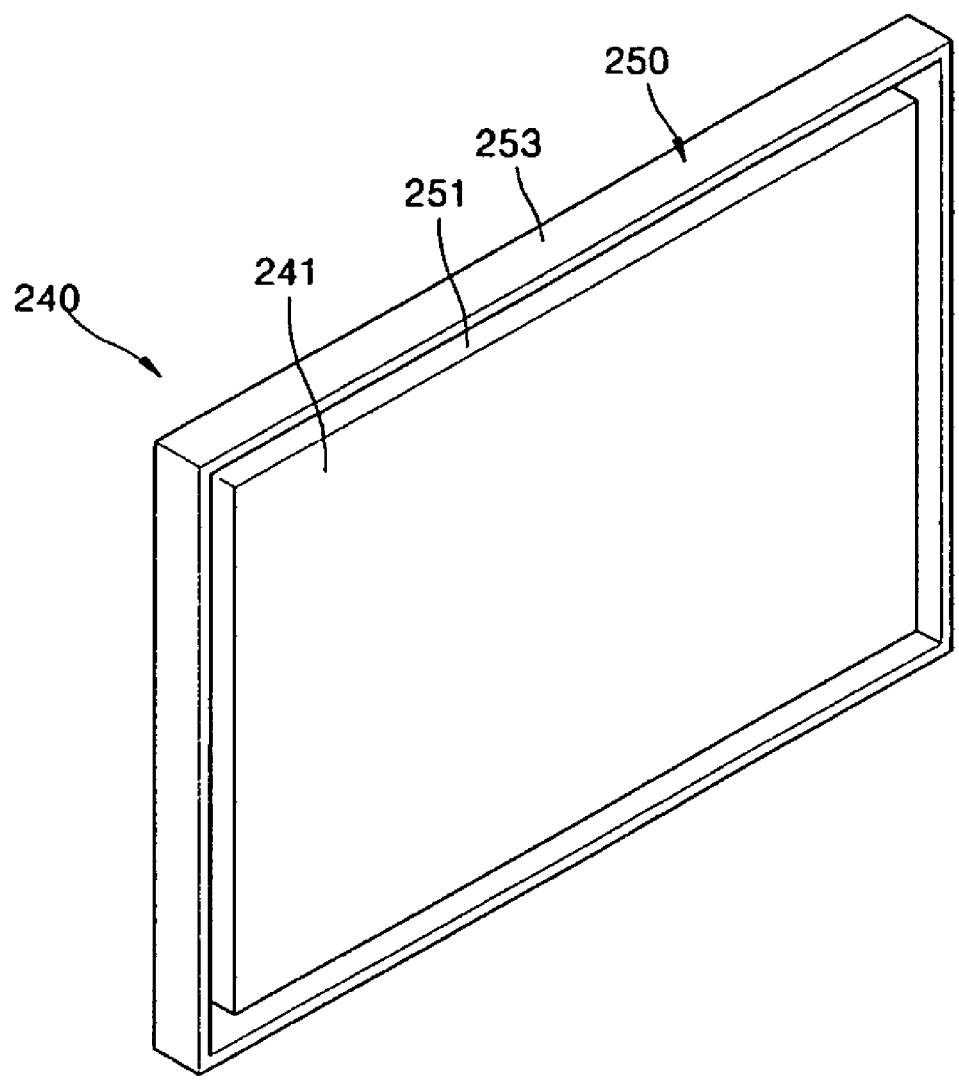
FIG. 9 is a rear perspective view of a chassis base shown in FIG. 8.

FIG. 8 is an exploded perspective view of a plasma display apparatus according to a second embodiment. FIG. 9 is a rear perspective view of a chassis base shown in FIG. 8. As shown in FIGS. 8 and 9, a plasma display apparatus 200 may be equipped with a chassis base 240, extended bent parts 250 are respectively formed at all of the upper, lower, left and light edges of the chassis base 240, and the neighboring extended bent parts 250 are connected by a connection corner part 245. The extended bent part 250 and the connection corner part 245 may be formed in one body. Accordingly, the upper, lower, left and right edges of the chassis base 240 are jointlessly connected to further enhance the rigidity of the chassis base 240. A chassis base 240 having a jointlessly-connected extended bent part 250 may be formed through a drawing process using the ductility of metallic material such as aluminum or iron.

The device 175 may be seated on a second bent part 252 as shown in FIG. 8. In this case, the sectional side shown in FIG. 3 is identical to a corresponding sectional side of the plasma display apparatus 200. Referring to FIG. 3, a heat conductive member 192' is formed on at least a portion of the second bent part 252 on which the device 175 is seated. The heat conductive member 192' may be heat conductive grease or may also be a solid heat conductive sheet having high heat conductivity. Other types of heat conductive members 192' may also be used.

In order to further protect the device 175 from the outside, it may be advantageous that the device 175 is received in a groove so as not to be exposed to the outside. Accordingly, as shown in FIG. 4, the element seat groove Hc may be formed at the second bent part 252, and the heat conductive member 192" may be formed at least within the device 175 and the element seat groove Hc. The heat conductive member 192" may be heat conductive grease or may also be a solid heat conductive sheet having high heat conductivity. Other types of heat conductive members 192' may also be used.

The shield plate 180 may be formed to cover the signal-transmission member including the device 175. In this case, the heat conductive sheet 182 may be formed between at least the device 175 and an inner surface of the shield plate 180. Also, the side heat exhaust member 195 may be formed between the signal-transmission member 170 and the second bent part 252 in such a way to cover the device 175.

The heat conductive member 192", the shield plate 180 and the element seat groove Hc may be identical to those of the first embodiment in which the device 175 is seated on the second bent part 252. Other embodiments are possible.

Figure 10:
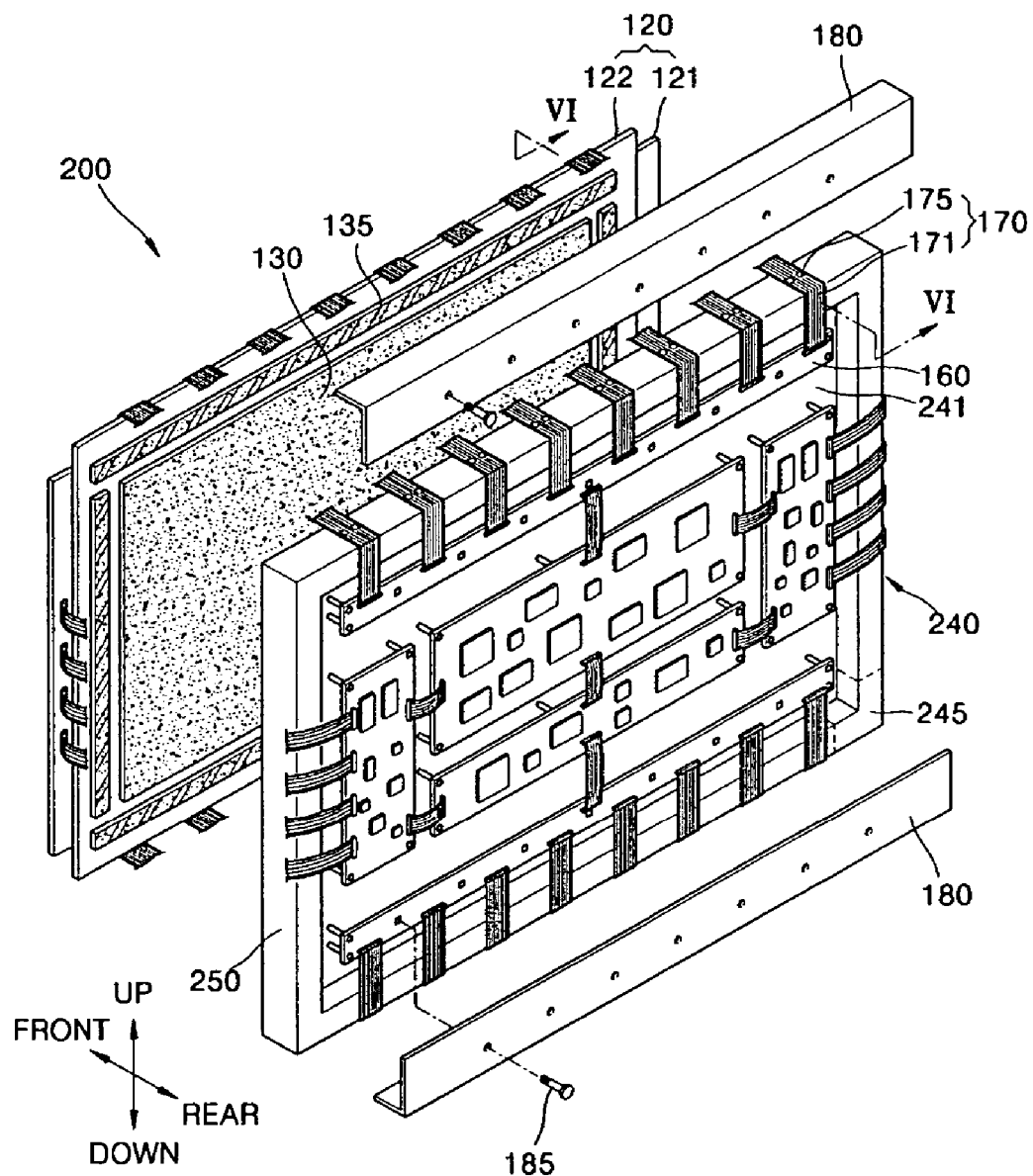
FIG. 10 is an exploded perspective view illustrating a modification of the plasma display apparatus shown in FIG. 8.

FIG. 10 is an exploded perspective view illustrating a modification of the plasma display apparatus shown in FIG. 8. Additionally, the device 175 may be seated on a third bent part 253 as shown in FIG. 10. The sectional side shown in FIG. 6 corresponds to a sectional side of the plasma display apparatus 200. Referring to FIG. 6, a heat conductive member 193' is formed on at least a portion of the third bent part 253 on which the device 175 is seated.

Also, as shown in FIG. 7, the element seat groove Hc receiving the device 175 may be formed at the third bent part 253. The heat conductive member 193" may be formed between at least the device 175 and the element seat groove Hc.

The shield plate 180 may be formed to cover the signal-transmission member including the device 175. In this case, the heat conductive sheet 182 may be formed at least within a portion of an inner surface of the shield plate 180 corresponding to the device 175. Also, the side heat exhaust member 195 may be formed between the signal-transmission member 170 and the third bent part 253 in such a way to cover the device 175.

The heat conductive member 193", the shield plate 180 and the element seat groove Hc may be identical to those of the first embodiment in which the device 175 is seated on the third bent part 253. Other embodiments are possible.

The first bent part 251 may be extended rearward from the base 241 as high as the position of the circuit board 160, the second bent part 252 may be arranged to align with the circuit board 160, and an extended end portion 253A of the third bent part 153 may be positioned further forward than the base part 241. The chassis base may have edges bent several times to thereby enhance flexural rigidity. Accordingly, additional reinforcement members are unnecessary for the chassis base, whereby the numbers of components and assembling processes and manufacturing costs for the plasma display apparatus can be reduced. The element applying a driving signal to the PDP may be mounted on the chassis base, so that an additional mount plate for mounting the element is not required. The edges of the chassis base may be formed integrally to protect the PDP, so that the corner portions of the PDP can be guarded from being damaged during the shipping of the PDP. The reinforcement members for reinforcing the chassis base are unnecessary or less necessary, and the rear space of the chassis base can be efficiently used for other aspects. Accordingly, more mounting space for electrical devices can be available in a small-sized plasma display apparatus. Also, more electrical devices may be installed on the rear surface of the chassis base so as to produce a high-resolution display image. The present invention can provide a plasma display module suitable for the high-resolution display image.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A plasma display apparatus comprising:
    a plasma display panel (PDP) configured to produce an image;
    a chassis base configured to support the PDP at a rear side of the PDP and comprising a base part formed substantially parallel to the PDP, and at least one extended bent part being formed in at least one of upper, lower, left and right edges of the base part;
    one or more circuit boards connected to a rear side of the chassis base and configured to drive the PDP,
    wherein the extended bent part comprises:
        a first bent part configured to extend in a rearward direction with respect to the base part;
        a second bent part configured to extend in a direction parallel to the chassis base with respect to the first bent part; and
        a third bent part configured to extend in a forward direction with respect to the second part,
    wherein the PDP and the circuit boards are electrically connected by at least one signal-transmission member, and the signal-transmission member is formed so as to cover the third bent part and the second bent part, wherein the signal-transmission member has at least one driving IC installed therein, and the driving IC is seated on at least one of the second and third bent parts;
    a shield plate arranged above the signal-transmission member to thereby shield and protect the signal-transmission member and an upper side of the driving IC, wherein the extended bent part of the of the chassis base is between the shield plate and the PDP; and
    a heat transfer strip between the driving IC and the shield plate.

2. The apparatus of claim 1, wherein a heat conductive member is positioned between the driving IC and the bent part on which the driving IC is seated.

3. The apparatus of claim 1, wherein an element seat groove which is concave toward the PDP is formed in a bent part on which the driving IC is seated.

4. The apparatus of claim 3, wherein a heat conductive member is positioned between the driving IC and the driving IC seat groove.

5. The apparatus of claim 1, wherein the third bent part is extended such that an extended portion thereof is positioned further forward than the base part.

6. The apparatus of claim 1, wherein the first bent part is extended rearward from the base part in substantially the same plane as the circuit board, and the second bent part is formed to substantially align with the circuit board.

7. The apparatus of claim 1, wherein the chassis base further comprises a connection bracket connecting a neighboring extended bent part formed on a neighboring one of the edges.

8. A plasma display apparatus comprising:
    a plasma display panel (PDP) configured to produce an image;
    a chassis base configured to support the PDP at a rear side of the PDP and comprising a base part formed substantially parallel to the PDP, at least one extended bent part being formed in at least one of upper, lower, left and right edges of the base part, and a connection corner part configured to connect to a neighboring extended bent part formed on a neighboring one of the edges; and
    one or more circuit boards connected to a rear side of the chassis base and configured to drive the PDP,
    wherein the extended bent part comprises:
        a first bent part configured to extend in a rearward direction with respect to the base part;
        a second bent part configured to extend in a direction parallel to the chassis base with respect to the first bent part; and
        a third bent part configured to extend in a direction forward with respect to the second part,
    wherein the PDP and the circuit boards are electrically connected by at least one signal-transmission member, and the signal-transmission member is formed to cover the second and third bent parts, wherein the signal-transmission member has at least one driving IC installed therein, and the driving IC is seated on at least one of the third bent part and the second bent part;
    a shield plate arranged on the signal-transmission member to thereby shield and protect the signal-transmission member and an upper side of the driving IC, wherein the extended bent part of the of the chassis base is between the shield plate and the PDP; and
    a heat transfer strip between the driving IC and the shield plate.

9. The apparatus of claim 8, wherein the connection corner part and the extended bent part are integrally formed.

10. The apparatus of claim 9, wherein the extended bent part and the connection corner part are formed by a drawing process.

11. The apparatus of claim 8, wherein a heat conductive member is positioned between the driving IC and the bent part on which the driving IC is seated.

12. The apparatus of claim 8, wherein a driving IC seat groove, which is concave toward the PDP is formed in a bent part on which the driving IC is seated.

13. The apparatus of claim 12, wherein a heat conductive member is positioned between the driving IC and the driving IC seat groove.

14. The apparatus of claim 8, wherein the first bent part is extended rearward from the base part in substantially the same plane as the circuit board, and the second bent part is formed to substantially align with the circuit board.

15. The apparatus of claim 8, wherein the third bent part is extended such that an extended portion thereof is positioned further forward than the base part.

* * * * *